United States Patent
Zhu et al.

(10) Patent No.: US 10,763,811 B2
(45) Date of Patent: Sep. 1, 2020

(54) GAIN CONTROL IN A CLASS-D OPEN-LOOP AMPLIFIER

(71) Applicant: Cirrus Logic International Semiconductor Ltd., Edinburgh (GB)

(72) Inventors: Lei Zhu, Austin, TX (US); Tejasvi Das, Austin, TX (US); John L. Melanson, Austin, TX (US); Wai-shun Wilson Shum, Austin, TX (US); Jing Bai, Austin, TX (US); Xin Zhao, Austin, TX (US); Xiaofan Fei, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 72 days.

(21) Appl. No.: 16/181,762

(22) Filed: Nov. 6, 2018

(65) Prior Publication Data

US 2020/0036352 A1 Jan. 30, 2020

Related U.S. Application Data

(60) Provisional application No. 62/703,298, filed on Jul. 25, 2018.

(51) Int. Cl.
*H03G 3/30* (2006.01)
*H03F 3/217* (2006.01)
(Continued)

(52) U.S. Cl.
CPC .............. *H03G 3/301* (2013.01); *H03F 3/187* (2013.01); *H03F 3/2175* (2013.01); *H03F 3/387* (2013.01);
(Continued)

(58) Field of Classification Search
CPC ....................................................... H03G 3/301
See application file for complete search history.

(56) References Cited

U.S. PATENT DOCUMENTS

| | | | |
|---|---|---|---|
| 5,559,467 | A | 9/1996 | Smedley |
| 6,741,123 | B1 | 5/2004 | Andersen et al. |
| | | (Continued) | |

FOREIGN PATENT DOCUMENTS

| | | |
|---|---|---|
| EP | 2587665 A1 | 5/2013 |
| WO | 2008067260 A1 | 6/2008 |

OTHER PUBLICATIONS

International Search Report and Written Opinion of the International Searching Authority, International Application No. PCT/GB2019/043204, dated Nov. 7, 2019.

*Primary Examiner* — Patricia T Nguyen
(74) *Attorney, Agent, or Firm* — Jackson Walker L.L.P.

(57) ABSTRACT

A system may include a digital modulator configured to modulate an input signal received at an input of the digital modulator to generate a modulated input signal at an output of the digital modulator, a digital gain element having a digital gain and coupled to the digital modulator, an open-loop Class-D amplifier coupled to an output of the digital modulator and configured to amplify the modulated input signal, wherein the open-loop Class-D amplifier is powered from a variable power supply having a variable supply voltage which is variable in response to one or more characteristics of the input signal, and a control circuit configured to control the digital gain to approximately cancel changes in an analog gain of the open-loop Class-D amplifier due to variation in the variable supply voltage in response to the one or more characteristics of the input signal.

20 Claims, 3 Drawing Sheets

(51) Int. Cl.
*H03F 3/187* (2006.01)
*H03F 3/387* (2006.01)

(52) U.S. Cl.
CPC ....... *H03G 3/3089* (2013.01); *H03F 2200/03* (2013.01); *H03F 2200/351* (2013.01); *H03F 2200/471* (2013.01); *H03G 2201/508* (2013.01)

(56) References Cited

U.S. PATENT DOCUMENTS

| | | | |
|---|---|---|---|
| 9,998,823 B2* | 6/2018 | He | H03G 3/20 |
| 10,181,845 B1* | 1/2019 | Das | H03F 3/183 |
| 10,476,455 B1* | 11/2019 | Astrachan | H03F 3/187 |
| 2004/0222846 A1 | 11/2004 | Melanson et al. | |
| 2008/0123873 A1* | 5/2008 | Bjorn-Josefsen | H03G 3/001 |
| | | | 381/106 |
| 2011/0080217 A1 | 4/2011 | Lee et al. | |
| 2013/0108081 A1 | 5/2013 | Ozaki et al. | |
| 2013/0229230 A1* | 9/2013 | Kinyua | H03F 3/217 |
| | | | 330/251 |
| 2015/0180430 A1* | 6/2015 | Wang | H03F 3/217 |
| | | | 381/120 |
| 2015/0295584 A1 | 10/2015 | Das et al. | |
| 2017/0272045 A1* | 9/2017 | Chadha | H03F 3/2173 |
| 2017/0294888 A1* | 10/2017 | Berkhout | H03F 1/26 |

* cited by examiner

GAIN CONTROL IN A CLASS-D OPEN-LOOP AMPLIFIER

RELATED APPLICATION

The present disclosure claims priority to U.S. Provisional Patent Application Ser. No. 62/703,298, filed Jul. 25, 2018, which is incorporated by reference herein in its entirety.

FIELD OF DISCLOSURE

The present disclosure relates in general to circuits for audio and haptic devices, including without limitation personal audio devices, such as wireless telephones and media players, or devices comprising a haptic module.

BACKGROUND

Personal audio devices, including wireless telephones, such as mobile/cellular telephones, cordless telephones, mp3 players, and other consumer audio devices, are in widespread use. Such personal audio devices may include circuitry for driving a pair of headphones or one or more speakers. Such circuitry often includes a power amplifier for driving an audio output signal to headphones or speakers. Generally speaking, a power amplifier amplifies an audio signal by taking energy from a power supply and controlling an audio output signal to match an input signal shape but with a larger amplitude.

One example of an audio amplifier is a class-D amplifier. A class-D amplifier (also known as a "switching amplifier") may comprise an electronic amplifier in which the amplifying devices (e.g., transistors, typically metal-oxide-semiconductor field effect transistors) operate as electronic switches. In a class-D amplifier, a signal to be amplified may be converted to a series of pulses by pulse-width modulation, pulse-density modulation, or another method of modulation, such that the signal is converted into a modulated signal in which a characteristic of the pulses of the modulated signal (e.g., pulse widths, pulse density, etc.) is a function of the magnitude of the signal. After amplification with a class-D amplifier, the output pulse train may be converted to an unmodulated analog signal by passing through a passive low-pass filter, wherein such low-pass filter may be inherent in the class-D amplifier or a load driven by the class-D amplifier. Class-D amplifiers are often used due to the fact that they may be more power efficient than linear analog amplifiers, in that class-D amplifiers may dissipate less power as heat in active devices as compared to linear analog amplifiers.

SUMMARY

In accordance with the teachings of the present disclosure, one or more disadvantages and problems associated with existing approaches to processing signals with an amplifier may be reduced or eliminated.

In accordance with embodiments of the present disclosure, a system may include a digital modulator configured to modulate an input signal received at an input of the digital modulator to generate a modulated input signal at an output of the digital modulator, a digital gain element having a digital gain and coupled to the digital modulator, an open-loop Class-D amplifier coupled to an output of the digital modulator and configured to amplify the modulated input signal, wherein the open-loop Class-D amplifier is powered from a variable power supply having a variable supply voltage which is variable in response to one or more characteristics of the input signal, and a control circuit configured to control the digital gain to approximately cancel changes in an analog gain of the open-loop Class-D amplifier due to variation in the variable supply voltage in response to the one or more characteristics of the input signal.

In accordance with these and other embodiments of the present disclosure, a method may include, in a system having a digital modulator configured to modulate an input signal received at an input of the digital modulator to generate a modulated input signal at an output of the digital modulator, a digital gain element having a digital gain and coupled to the digital modulator, and an open-loop Class-D amplifier coupled to an output of the digital modulator and configured to amplify the modulated input signal, wherein the open-loop Class-D amplifier is powered from a variable power supply having a variable supply voltage which is variable in response to one or more characteristics of the input signal, controlling the digital gain to approximately cancel changes in an analog gain of the open-loop Class-D amplifier due to variation in the variable supply voltage in response to the one or more characteristics of the input signal.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
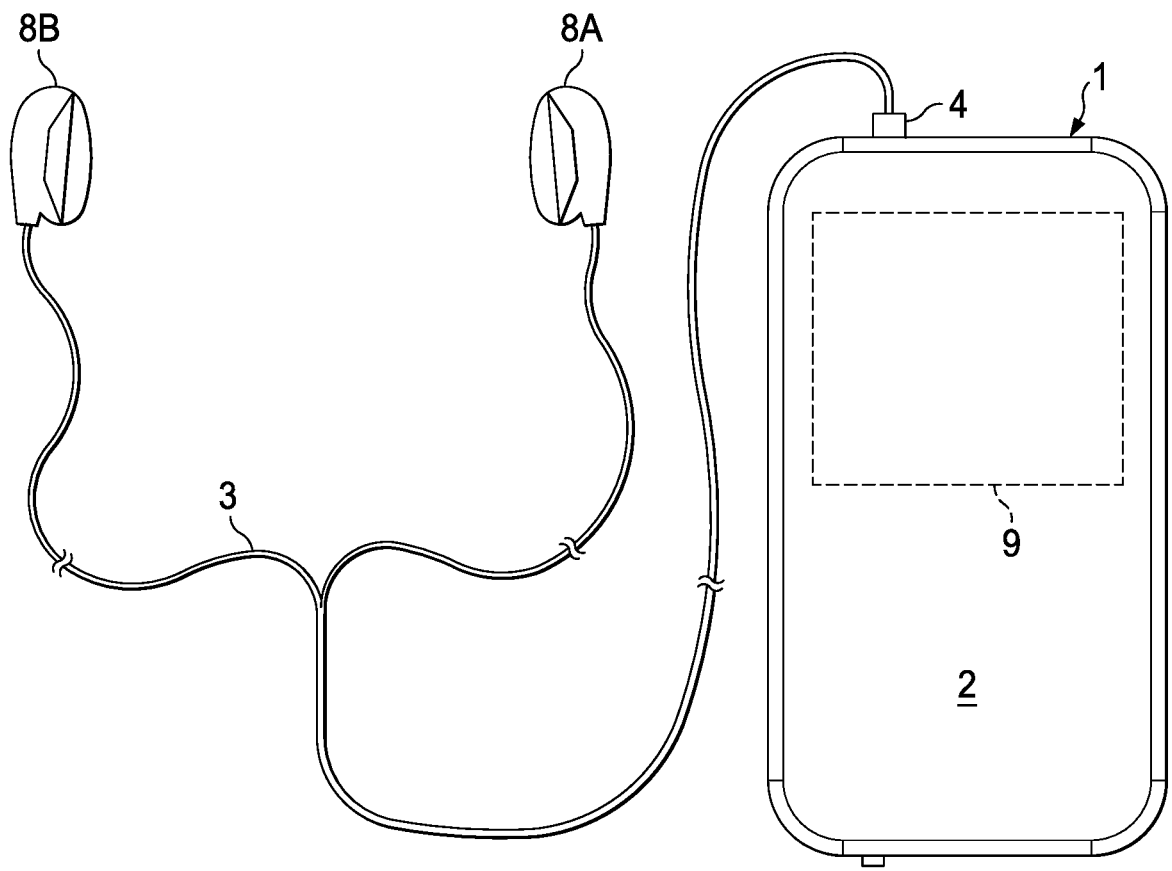
FIG. 1 is an illustration of an example personal audio device, in accordance with embodiments of the present disclosure.

FIG. 1 is an illustration of an example personal audio device 1, in accordance with embodiments of the present disclosure. FIG. 1 depicts personal audio device 1 coupled to a headset 3 in the form of a pair of earbud speakers 8A and 8B. Headset 3 depicted in FIG. 1 is merely an example, and it is understood that personal audio device 1 may be used in connection with a variety of audio transducers, including without limitation, headphones, earbuds, in-ear earphones, and external speakers. A plug 4 may provide for connection of headset 3 to an electrical terminal of personal audio device 1. Alternatively, in some embodiments, headset 3 may be wirelessly coupled (such as, for example, through a Bluetooth® connection) to personal audio device 1. Personal audio device 1 may provide a display to a user and receive user input using a touch screen 2, or alternatively, a standard liquid crystal display (LCD) may be combined with various buttons, sliders, and/or dials disposed on the face and/or sides of personal audio device 1. As also shown in FIG. 1, personal audio device 1 may include an audio integrated circuit (IC) 9 for generating an analog audio signal for transmission to headset 3 and/or another audio transducer (e.g., a loudspeaker).

Figure 2:
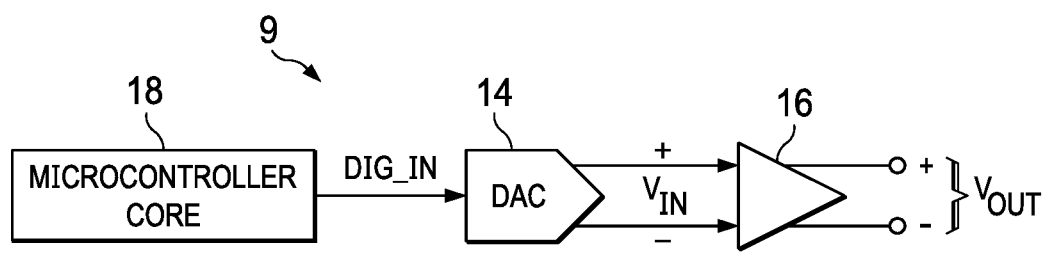
FIG. 2 is a block diagram of selected components of an example audio integrated circuit of a personal audio device, in accordance with embodiments of the present disclosure.

FIG. 2 is a block diagram of selected components of an example audio IC 9 of a personal audio device, in accordance with embodiments of the present disclosure. In some embodiments, example audio IC 9 may be used to implement audio IC 9 of FIG. 1. As shown in FIG. 2, a microcontroller core 18 (e.g., a digital signal processor or "DSP") may supply a digital audio input signal DIG_IN to a digital-to-analog converter (DAC) 14, which may convert the digital audio input signal to an analog input signal $V_{IN}$. DAC 14 may supply analog signal $V_{IN}$ to an amplifier 16 which may amplify or attenuate analog input signal $V_{IN}$ to provide an audio output signal $V_{OUT}$, which may operate a speaker, headphone transducer, a line level signal output, and/or other suitable output.

The foregoing contemplates that an audio IC 9 including an amplifier 16 may reside within personal audio device 1. However, in some embodiments, such as when headset 3 is a wireless headset, amplifier 16 and one or more other components of audio IC 9 may reside within headset 3.

Figure 3:
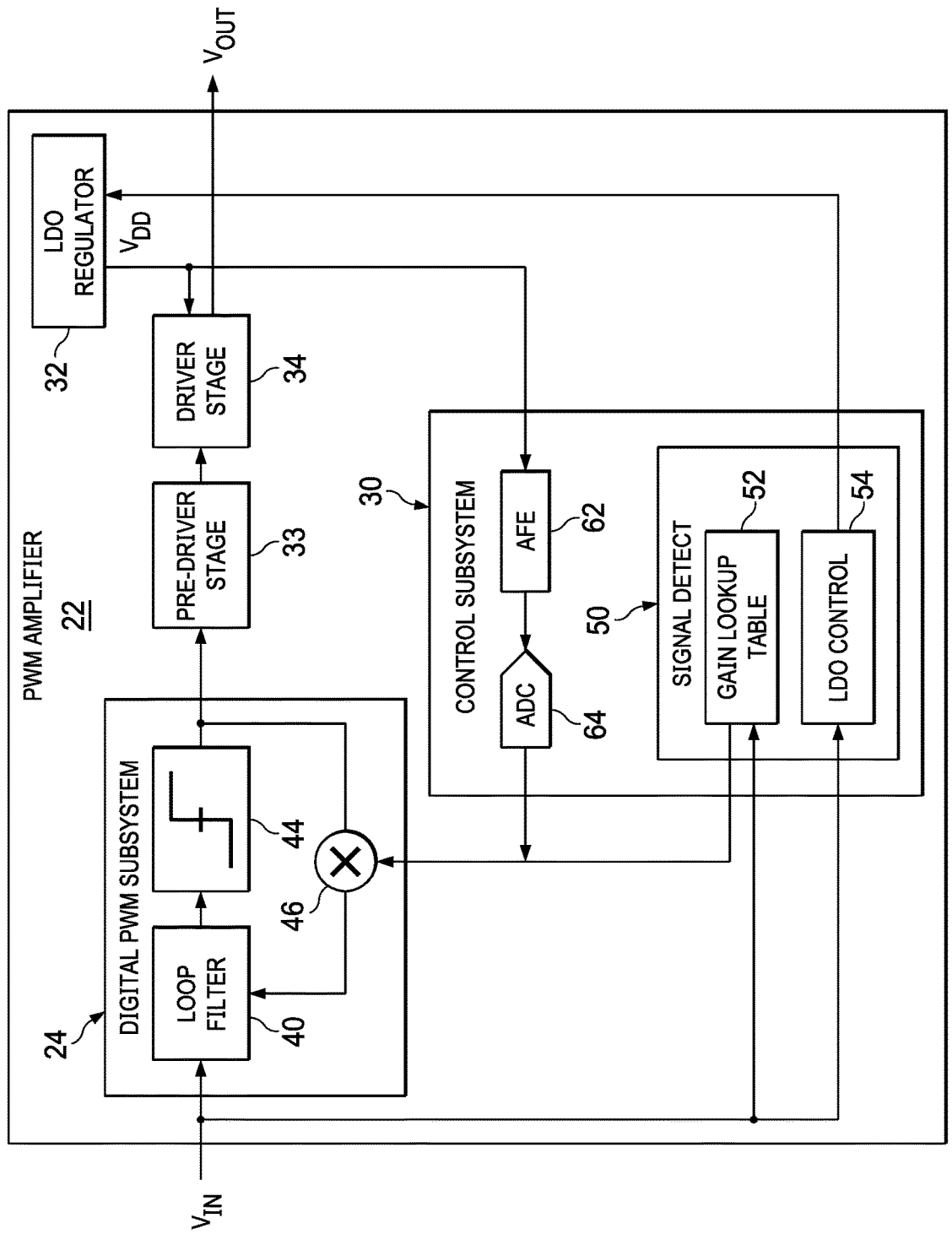
FIG. 3 is a block diagram of selected components of an example pulse width modulation amplifier, in accordance with embodiments of the present disclosure.

FIG. 3 is a block diagram of selected components of an example pulse width modulation (PWM) amplifier 22, in accordance with embodiments of the present disclosure. In some embodiments, example pulse width modulation amplifier 22 may be used to implement all or a portion of amplifier 16 of FIG. 2. As shown in FIG. 3, example pulse width modulation amplifier 22 may include a digital PWM subsystem 24, a pre-driver stage 33, a driver stage 34 powered from a low-dropout (LDO) regulator 32, and a control subsystem 30.

As shown, PWM amplifier 22 may operate as a digital open-loop class-D amplifier, utilizing the signal path formed by digital PWM subsystem 24, pre-driver stage 33, and driver stage 34. Digital PWM subsystem 24 may comprise any suitable system, device, or apparatus for converting input signal $V_{IN}$ into an equivalent PWM signal. As shown in FIG. 3, digital PWM subsystem 24 may comprise a feedforward path including a loop filter 40, a quantizer 44, and a feedback path comprising a digital gain element 46.

Loop filter 40 may comprise any system, device, or apparatus configured to receive an input signal (e.g., input signal $V_{IN}$ or a derivative thereof) and a feedback signal (e.g., output of quantizer 44) and based on such input signal and feedback signal, generate a filtered input signal to be communicated to quantizer 44. In some embodiments, such filtered input signal may comprise a signal indicative of an integrated error between the input signal and the feedback signal.

Quantizer 44 may comprise any system, device, or apparatus configured to quantize a signal (e.g., the filtered input signal) to generate an equivalent digital PWM signal.

Digital gain element 46 may comprise any system, device, or apparatus configured to have a variable digital gain and apply such variable digital gain to the digital PWM signal output by quantizer 44 to generate a feedback signal to loop filter 40. As shown in FIG. 3 and described in greater detail below, the variable digital gain of digital gain element 46 may be controlled by one or more control signals generated by control subsystem 30.

Pre-driver stage 33 may comprise any system, device, or apparatus configured to receive a quantized PWM signal (e.g., as generated by digital PWM subsystem 24) and condition such signal for driver stage 34. Accordingly, pre-driver stage 33 may comprise a signal buffer and/or other logic elements to provide control of gate terminals of switches of driver stage 34.

Driver stage 34 may comprise any system, device, or apparatus configured to receive a quantized PWM signal (e.g., as generated by digital PWM subsystem 24 and conditioned by pre-driver stage 33) and drive an output signal to a transducer (e.g., an audio transducer, haptic transducer, or other transducer). Accordingly, driver stage 34 may comprise a plurality of output switches configured to generate output signal $V_{OUT}$ from a modulated signal generated by digital PWM subsystem 24.

As shown in FIG. 3, LDO regulator 32 may supply electrical energy via supply voltage $V_{DD}$ to driver stage 34, such that driver stage 34 may use such electrical energy to generate output signal $V_{OUT}$. As known in the art, an LDO regulator may comprise a direct-current linear voltage regulator that may regulate its output voltage even when an input voltage of the LDO regulator is very close to its output voltage. Also as shown in FIG. 3 and described in greater detail below, the supply voltage VDD generated by LDO regulator 32 may be variable under the control of one or more control signals generated by control subsystem 30. In some embodiment, LDO regulator 32 may operate in a plurality of modes, the plurality of modes comprising a quick-charge mode in which variable supply voltage $V_{DD}$ is substantially instantaneously modified to a new value wherein the new value is based on one or more characteristics of input signal $V_{IN}$. In such embodiments, the plurality of modes may further comprise a second mode in which the variable supply voltage $V_{DD}$ is modified to the new value, wherein the rate of modification to the new value is limited to a slew rate.

Control subsystem 30 may include any system, device, or apparatus configured to receive an input signal (e.g., input signal $V_{IN}$) and based on one or more characteristics of the input signal, control a variable supply voltage (e.g., supply voltage $V_{DD}$) generated by an LDO regulator (e.g., LDO regulator 32), using LDO control block 54 of signal detect circuit 50. Such one or more characteristics of the input signal comprise one or more of a magnitude of the input signal, a signal frequency of the input signal, and a signal ramp rate (e.g., a rate of increase or decrease of the magnitude) of the input signal. For example, when the one or more characteristics of the input signal comprise one or more of a magnitude of the input signal, the variable supply voltage may track a signal envelope of the input signal.

In addition or alternatively, control subsystem 30 may also be configured to monitor the variable supply voltage (e.g., supply voltage $V_{DD}$) and control the variable digital gain of digital gain element 46 based on variation in the variable supply voltage as detected by the monitoring of the variable supply voltage. For example, as variable supply voltage $V_{DD}$ increases, an analog gain of driver stage 34 may increase, and such increase in analog gain may be compensated by control subsystem 30 detecting the increase in variable supply voltage/analog gain and decreasing the variable digital gain of digital gain element 46 in response. Likewise, as variable supply voltage $V_{DD}$ decreases, the analog gain of driver stage 34 may decrease, and such decrease in analog gain may be compensated by control subsystem 30 detecting the decrease in variable supply voltage/analog gain and increasing the variable digital gain of digital gain element 46 in response. In order to provide such monitoring and control, control subsystem 30 may include an analog front end (AFE) 62 coupled to LDO regulator 32 for receiving supply voltage $V_{DD}$ and conditioning the sensed supply voltage $V_{DD}$ and outputting the conditioned supply voltage $V_{DD}$ to an analog-to-digital converter 64 coupled to AFE 62, which may be configured to convert the conditioned supply voltage signal to an equivalent digital signal which may be used to control the variable digital gain of gain element 46. Thus, control subsystem 30 may be configured to control the digital gain of digital gain element 46 to approximately cancel changes in an analog gain of the open-loop Class-D amplifier (PWM amplifier 22) due to a variation in the variable supply voltage (supply voltage $V_{DD}$) in response to the one or more characteristics of the input signal (e.g., one or more of a magnitude of the input signal, a signal frequency of the input signal, and a signal ramp rate of the input signal, as discussed in greater detail elsewhere in this disclosure).

In addition or alternatively, control subsystem 30 may also be configured to detect, with signal detect circuit 50, one or more characteristics of input signal $V_{IN}$ (e.g., one or more of a magnitude of the input signal, a signal frequency of the input signal, and a signal ramp rate of the input signal) and apply the one or more characteristics of the input signal as an index to a gain lookup table 52 in order to set the variable digital gain of gain element 46 in accordance with the entry of the gain lookup table 52 indexed by the one or more characteristics. The various entries may include values of digital gain that may be applied to compensate for changes in supply voltage $V_{DD}$ made by control subsystem 30 in response to the one or more characteristics of input signal $V_{IN}$. For example, the table below represents an example embodiment of gain lookup table 52:

| Signal level | Digital Gain (dB) | $V_{DD}$ (V) |
|---|---|---|
| [-∞, -15 dBv] | 0 | 0.5 |
| [-15 dBv, -6 dBv] | -3 | 0.7 |
| [-6 dBv, 0] | -6 | 1 |

As shown in the example table above, a magnitude range (e.g., -∞ to -15 dBv, -15 dBv to -6 dBv, -6 dBv to 0) of the signal level of input signal $V_{IN}$ may be used as an index to an entry gain lookup table 52, wherein the entry may include a digital gain to be applied by gain element 46 and a corresponding supply voltage $V_{DD}$ to be output by LDO regulator 32.

In some embodiments, as noted above, a signal frequency and/or signal ramp rate of input signal $V_{IN}$ may be used to set the digital gain of gain element 46 and the corresponding supply voltage $V_{DD}$ to be output by LDO regulator 32. For example, if signal frequency of input signal $V_{IN}$ is lower than a threshold frequency and the signal ramp rate of input signal $V_{IN}$ is below a threshold ramp rate, signal detect circuit 50 may simply apply a digital gain of gain element 46 and the corresponding supply voltage $V_{DD}$ to be output by LDO regulator 32 based on signal-level indexed entries as set forth in the table below. However, in such example, if signal frequency of input signal $V_{IN}$ is higher than the threshold frequency or the signal ramp rate of input signal $V_{IN}$ is above a threshold ramp rate, signal detect circuit 50 may apply the lowest digital gain of gain element 46 and the corresponding highest supply voltage $V_{DD}$ to be output by LDO regulator 32 (e.g., apply the last row of gain lookup table 52 when either or both of the signal frequency and the signal ramp rate is above their respective thresholds).

In some embodiments, PWM amplifier 22 may include the functionality relating to monitoring supply voltage $V_{DD}$ and modifying the variable digital gain based on such monitoring, but may not include the functionality relating to selecting a digital gain from gain lookup table 52 based on input voltage $V_{IN}$. In other embodiments, PWM amplifier 22 may not include the functionality relating to monitoring supply voltage $V_{DD}$ and modifying the variable digital gain based on such monitoring, but may include the functionality relating selecting a digital gain from gain lookup table 52 based on input voltage $V_{IN}$.

In yet other embodiments, PWM amplifier 22 may include the functionality relating to monitoring supply voltage $V_{DD}$ and modifying the variable digital gain based on such monitoring, as well as include the functionality relating to selecting a digital gain from gain lookup table 52 based on input voltage $V_{IN}$. In some of such embodiments, the functionality relating to selecting a digital gain from gain lookup table 52 based on input voltage $V_{IN}$ may be used to set a "coarse" digital gain level for gain element 46 and the functionality relating to monitoring supply voltage $V_{DD}$ and modifying the variable digital gain based on such monitoring may be used to set a "fine" digital gain level for gain element 46 that refines the coarse setting defined by gain lookup table 52.

In some embodiments, PWM modulation amplifier 22 may represent a portion of a larger reconfigurable PWM modulation amplifier, such as the reconfigurable PWM modulation amplifier disclosed in U.S. patent application Ser. No. 16/133,045, filed Sep. 17, 2018, and incorporated by reference herein.

Figure 4:
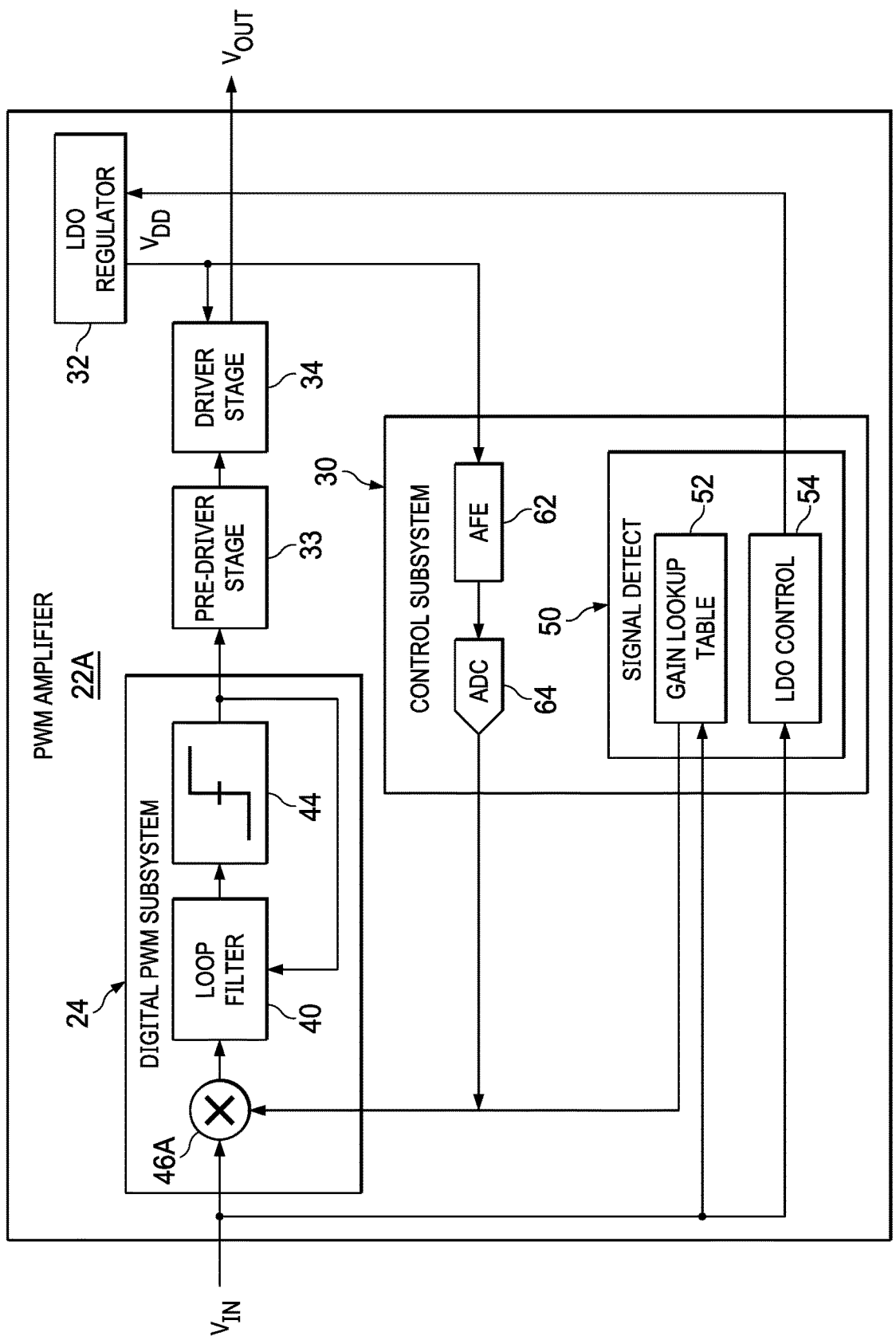
FIG. 4 is a block diagram of selected components of another example pulse width modulation amplifier, in accordance with embodiments of the present disclosure.

FIG. 4 is a block diagram of selected components of an example PWM amplifier 22A, in accordance with embodiments of the present disclosure. In some embodiments, example pulse width modulation amplifier 22A may be used to implement all or a portion of amplifier 16 of FIG. 2. Example PWM amplifier 22A of FIG. 4 may be in many respects similar to PWM amplifier 22 of FIG. 3. Accordingly, only the differences between PWM amplifier 22A and PWM amplifier 22 may be discussed below.

In particular, one difference between PWM amplifier 22A and PWM amplifier 22 is that PWM amplifier 22A includes a gain element 46A which applies a variable digital gain to the input of digital PWM subsystem 24 (e.g., to input voltage $V_{IN}$) in lieu of gain element 46 of PWM amplifier 22. As is the case with PWM amplifier 22, control subsystem 30 may generate control signals to control the variable digital gain 46A, in order to compensate for changes in analog gain of driver stage 34 caused by variation of variable supply voltage $V_{DD}$ responsive to one or more characteristics of input voltage $V_{IN}$.

Although the foregoing contemplates use of PWM amplifiers 22 and 22A for use in an audio amplifier for driving an audio transducer, it is understood that PWM amplifiers 22 and 22A may be used in other types of amplifiers for driving other types of transducers, including without limitation an amplifier for driving a haptic transducer.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A system comprising:
    a digital modulator configured to modulate an input signal received at an input of the digital modulator to generate a modulated input signal at an output of the digital modulator;
    a digital gain element having a digital gain and coupled to the digital modulator;
    an open-loop Class-D amplifier coupled to an output of the digital modulator and configured to amplify the modulated input signal, wherein the open-loop Class-D amplifier is powered from a variable power supply having a variable supply voltage which is variable in response to one or more characteristics of the input signal; and
    a control circuit configured to control the digital gain to approximately cancel changes in an analog gain of the open-loop Class-D amplifier due to a variation in the variable supply voltage in response to the one or more characteristics of the input signal.

2. The system of claim 1, wherein the digital gain element is integral to a feedback path of the digital modulator coupled between the output of the digital modulator and the input of the digital modulator.

3. The system of claim 1, wherein the digital gain element applies the digital gain to the input of the digital modulator.

4. The system of claim 1, wherein the control circuit is configured to control the digital gain by:
    monitoring the variable supply voltage; and
    controlling the digital gain based on the variation in the variable supply voltage as detected by the monitoring of the variable supply voltage.

5. The system of claim 4, wherein the control circuit comprises:
    an analog front end coupled to the variable power supply; and
    an analog-to-digital converter coupled to the analog front end.

6. The system of claim 4, wherein the control circuit is configured to control the digital gain by:
    applying the one or more characteristics of the input signal as an index to a gain lookup table; and
    setting the digital gain in accordance to an entry of the gain lookup table indexed by the one or more characteristics.

7. The system of claim 1, wherein the control circuit is configured to control the digital gain by:
    applying the one or more characteristics of the input signal as an index to a gain lookup table; and
    setting the digital gain in accordance to an entry of the gain lookup table indexed by the one or more characteristics.

8. The system of claim 1, wherein the variable power supply operates in a plurality of modes comprising a quick-charge mode in which the variable supply voltage is substantially instantaneously modified to a new value wherein the new value is based on the one or more characteristics of the input signal.

9. The system of claim 8, wherein the plurality of modes further comprises a second mode in which the variable supply voltage is modified to the new value, wherein the rate of modification to the new value is limited to a slew rate.

10. The system of claim 1, wherein the one or more characteristics of the input signal comprise one or more of a magnitude of the input signal, a signal frequency of the input signal, and a signal ramp rate of the input signal.

11. A method comprising, in a system having a digital modulator configured to modulate an input signal received at an input of the digital modulator to generate a modulated input signal at an output of the digital modulator, a digital gain element having a digital gain and coupled to the digital modulator, and an open-loop Class-D amplifier coupled to an output of the digital modulator and configured to amplify the modulated input signal, wherein the open-loop Class-D amplifier is powered from a variable power supply having a variable supply voltage which is variable in response to one or more characteristics of the input signal:

controlling the digital gain to approximately cancel changes in an analog gain of the open-loop Class-D amplifier due to a variation in the variable supply voltage in response to the one or more characteristics of the input signal.

12. The method of claim 11, wherein the digital gain element is integral to a feedback path of the digital modulator coupled between the output of the digital modulator and the input of the digital modulator.

13. The method of claim 11, wherein the digital gain element applies the digital gain to the input of the digital modulator.

14. The method of claim 11, wherein controlling the digital gain comprises:

monitoring the variable supply voltage; and controlling the digital gain based on the variation in the variable supply voltage as detected by the monitoring of the variable supply voltage.

15. The method of claim 14, wherein monitoring the variable supply voltage comprises:

receiving the variable supply voltage by an analog front end; and converting the variable supply voltage as conditioned by the analog front end to an equivalent digital signal with an analog-to-digital converter coupled to the analog front end.

16. The method of claim 14, wherein controlling the digital gain comprises:

applying the one or more characteristics of the input signal as an index to a gain lookup table; and setting the digital gain in accordance to an entry of the gain lookup table indexed by the one or more characteristics.

17. The method of claim 11, wherein controlling the digital gain comprises:

applying the one or more characteristics of the input signal as an index to a gain lookup table; and setting the digital gain in accordance to an entry of the gain lookup table indexed by the one or more characteristics.

18. The method of claim 11, wherein the variable power supply operates in a plurality of modes comprising a quick-charge mode in which the variable supply voltage is substantially instantaneously modified to a new value wherein the new value is based on the one or more characteristics of the input signal.

19. The method of claim 18, wherein the plurality of modes further comprises a second mode in which the variable supply voltage is modified to the new value, wherein the rate of modification to the new value is limited to a slew rate.

20. The method of claim 11, wherein the one or more characteristics of the input signal comprise one or more of a magnitude of the input signal, a signal frequency of the input signal, and a signal ramp rate of the input signal.

* * * * *